United States Patent [19]

Hori et al.

[11] 4,242,739
[45] Dec. 30, 1980

[54] MEMORY SYSTEM WITH A STABILIZED SENSE AMPLIFIER

[75] Inventors: Ryoichi Hori, Hinodemachi; Kiyoo Itoh, Higashi-kurume, both of Japan

[73] Assignee: Hitachi, Ltd., Japan

[21] Appl. No.: 26,188

[22] Filed: Apr. 2, 1979

[30] Foreign Application Priority Data

Mar. 31, 1978 [JP] Japan ................. 53-36774

[51] Int. Cl.³ ........................................... G11C 11/40
[52] U.S. Cl. ................................. 365/203; 307/238; 307/110
[58] Field of Search ............... 365/203; 307/238, 110

[56] References Cited
U.S. PATENT DOCUMENTS

| 4,044,341 | 8/1977 | Stewart | 365/203 |
| 4,060,740 | 11/1977 | Nishimura | 365/203 |

Primary Examiner—Terrell W. Fears
Attorney, Agent, or Firm—Craig & Antonelli

[57] ABSTRACT

In a memory system where certain memory systems a signal detector is provided which begins to detect the voltage of a data line to which a plurality of memory cells are connected when the voltage of a latch node of the detector is shifted from a first to a second level by discharging the node through a switch in response to an input signal provided by a pulse circuit. To avoid discharging the node at an improper time, a signal transformation circuit is interposed between the pulse circuit and the switch to provide the switch with a signal to turn it on only when the level of the signal provided by the pulse circuit is high enough. In this manner, improper discharging due to shifts in the pulse circuit can be avoided.

14 Claims, 5 Drawing Figures

MEMORY SYSTEM WITH A STABILIZED SENSE AMPLIFIER

BACKGROUND OF THE INVENTION

The present invention relates to a memory system having a fast and stable sense amplifier with a high sensitivity, and, more particularly, to a monolithic memory system which makes use of field effect transistors as circuit elements.

A recently developed monolithic memory comprises a plurality of memory cells, each including a field effect transistor and a capacitance, and a differential sense amplifier having a flip-flop circuit constructed with field effect transistors. This sense amplifier differentially amplifies the voltages of a pair of data lines and detects the signal stored in a selected one of the memory cells. The flip-flop circuit has a latch node which is precharged to a predetermined voltage before the flip-flop circuit begins its amplifying operation. The data lines are also precharged to nearly the same voltage. Before the amplifying operation, the transistors which constitute the flip-flop circuit are in off states. Under that condition, the signal stored in one of the memory cells is read out, and the voltage of one of the data lines changes in response to the read out signal. Then, a discharging field effect transistor connected to the latch node of the flip-flop circuit is turned on.

As a result, the node voltage is lowered to 0 volts and the flip-flop circuit begins its amplifying operation. The switching of the discharging field-effect transistor is controlled by a voltage pulse supplied by a pulse circuit located at the periphery of the memory cell area. When the voltage pulse becomes higher than the threshold voltage $V_T$ of the field-effect transistor, the transistor becomes conductive. The transistor must become conductive after the signal stored in a memory cell is read out onto a corresponding data line.

One problem with this prior art memory system is that it often fails to operate normally when the threshold voltage $V_T$ is small for reasons discussed below.

In order to develop a memory with a higher packing density, it is necessary to reduce the sizes of the transistors used in the memory. It is also necessary to reduce the power supply voltage $V_{DD}$ which is provided to the transistors, in order to avoid the dielectric breakdown of the transistors due to scaling down the component size to achieve the higher packing density. At the same time, it is necessary to reduce the threshold voltage $V_T$ of the transistors in order to maintain a high speed operation. The switching speed of a field effect transistor is roughly proportional to $(V_G-V_T)^n$, where $V_G$ is a gate voltage and n is a an experimentally determined number among 1.0 and 2.0. If the gate voltage $V_G$ is assumed to be nearly equal to the power supply voltage $V_{DD}$, a lower threshold voltage $V_T$ is desirable when a lower supply voltage is used, in order to maintain a high speed operation.

If the discharging field effect transistor connected to the latch node of flip-flop circuit as discussed above has a lower threshold voltage $V_T$, the transistor is apt to become conductive even when it should be non-conductive, due to voltage drift of the voltage pulse provided to the gate thereof. As a result, the latch node of the flip-flop circuit begins to discharge during a period when it is not supposed to, and the circuit performs its amplifying operation, discharging the data lines. The output signal of the flip-flop circuit at the period when the amplified signal should be detected is then lowered because of the above-mentioned malfunction.

The voltage drift of the voltage pulse which causes this malfunction may be introduced because of several reasons. One of these reasons stems from the fact that pulse circuit which provides the voltage pulse is connected to a common ground line and provides a voltage pulse the level of which is dependent on the voltage of the common ground line at the point where the pulse circuit is connected thereto. The resistance value of the ground line is not negligible and several other peripheral circuits are also connected to this ground line. Each of these peripheral circuits introduces a current flow through the ground line while the circuit operates. As a result, the voltage of the ground line drifts depending on how many of the peripheral circuits are operating. Therefore, the discharging transistor begins to discharge during an undesirable period due to this voltage drift, if the threshold value $V_T$ is low.

LIST OF THE PRIOR ART

The following references are cited to show examples of the present state of the art:

(1) U.S. Pat. No. 4,061,999 issued to Proebsting et al., on Dec. 6, 1977 and (2) U.S. Pat. No. 3,810,124 issued to Hoffman et al., May 7, 1974.

SUMMARY OF THE INVENTION

It is, therefore, an object of the present invention to provide a memory system which maintains a stable operation of a signal detection amplifier in spite of the voltage drift of a control signal provided thereto.

It is another object of the present invention to provide a memory system which maintains a stable operation of a signal detection amplifier which amplifier includes a switching element with a low threshold voltage in the discharging circuit.

It is another object of the present invention to provide a memory system which maintains a stable operation of a discharging circuit in spite of the voltage drift of a control signal provided thereto.

According to the present invention, a memory system comprises a pulse circuit for generating a first pulse signal which can take two different levels and a signal transformation circuit for transforming this control pulse into a second pulse signal which is provided to the discharging circuit of a sense amplifier. The transformation circuit outputs a pulse signal with a level high enough to allow the discharging by the discharging circuit only when the first pulse signal has a level sufficiently greater than the threshold voltage of the discharge circuit.

DESCRIPTION OF THE PREFERRED EMBODIMENTS

Figure 1:
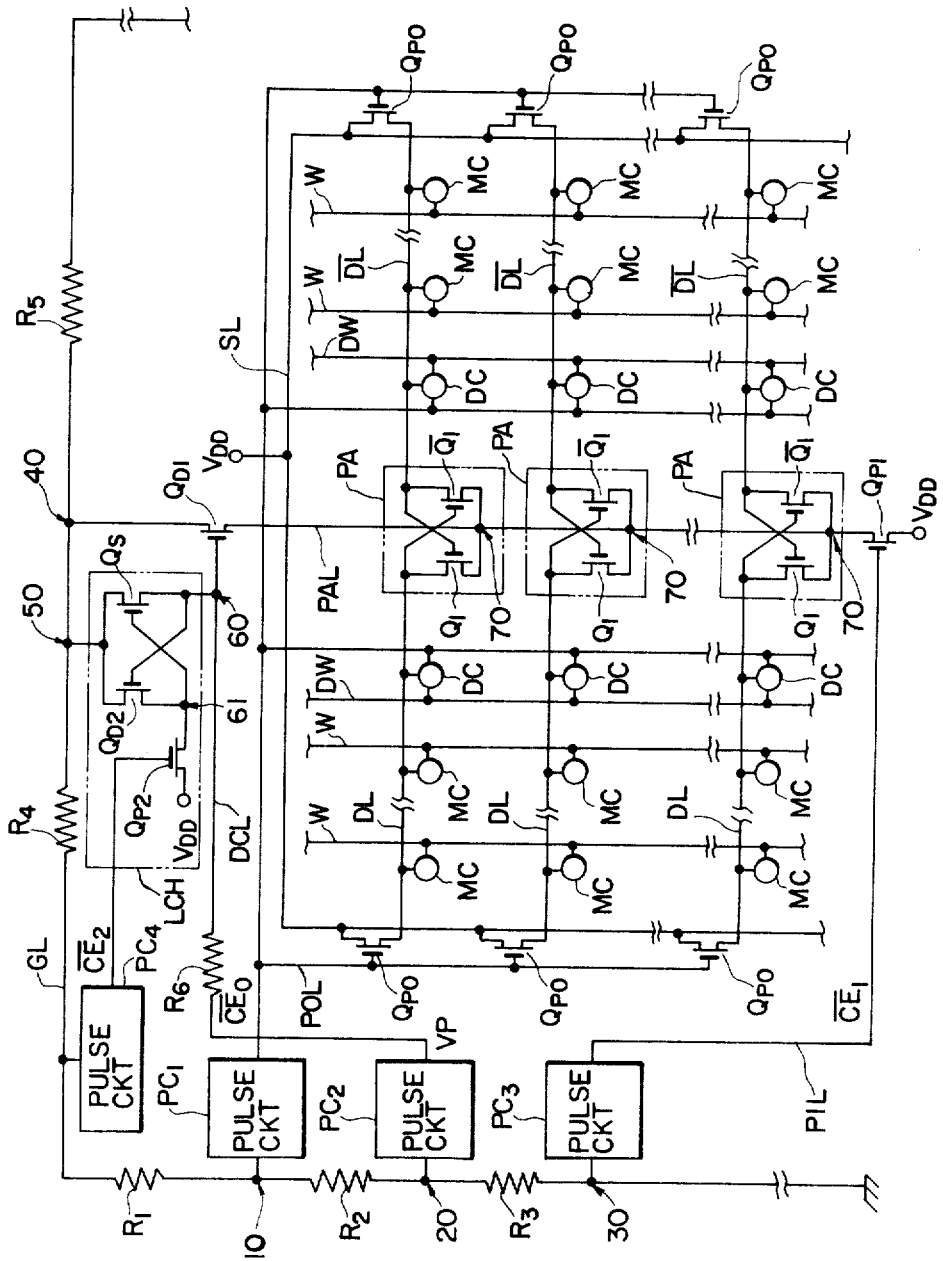
FIG. 1 shows a schematic circuit diagram of a memory system according to the present invention.

In FIG. 1 is shown a memory system which uses N channel field effect transistors, wherein a memory cell MC is located at each of the intersections of a plurality of data lines DL and $\overline{DL}$ and a plurality of word lines W, and a dummy cell DC is located at each of the intersections of the data lines DL and $\overline{DL}$ and dummy word lines DW. Circuits for enabling the word lines W and dummy word lines DW are not shown for the sake of simplicity.

Figure 2:
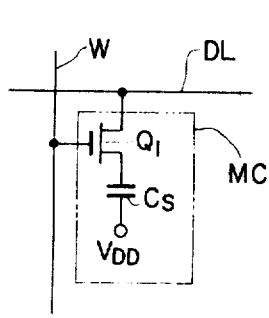
FIG. 2 shows a memory cell used in a memory system of FIG. 1.

Each memory cell MC comprises, as shown in FIG. 2, a field effect transistor $Q_1$ and a capacitance $C_S$ which are series-connected between a corresponding data line DL and a power supply voltage $V_{DD}$ of, for example, 5 volts. The gate electrode of the transistor $Q_1$ is connected to a corresponding word line W.

Figure 3:
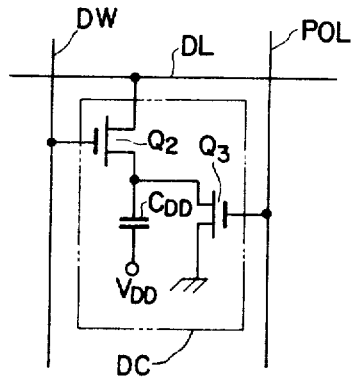
FIG. 3 shows a dummy cell used in a memory system of FIG. 1.

Each dummy cell DC comprises, as shown in FIG. 3, a field effect transistor $Q_2$ and a capacitance $C_{DD}$ which are series-connected between a corresponding data line DL and the power supply voltage $V_{DD}$, as well as a field effect transistor $Q_3$ which is parallel-connected to the capacitance $C_{DD}$. The gate electrodes of the transistors $Q_2$ and $Q_3$ are connected to a corresponding dummy word line DW and a precharge line POL, respectively. The source electrode of the transistor $Q_3$ is connected to the ground level.

Figure 4:
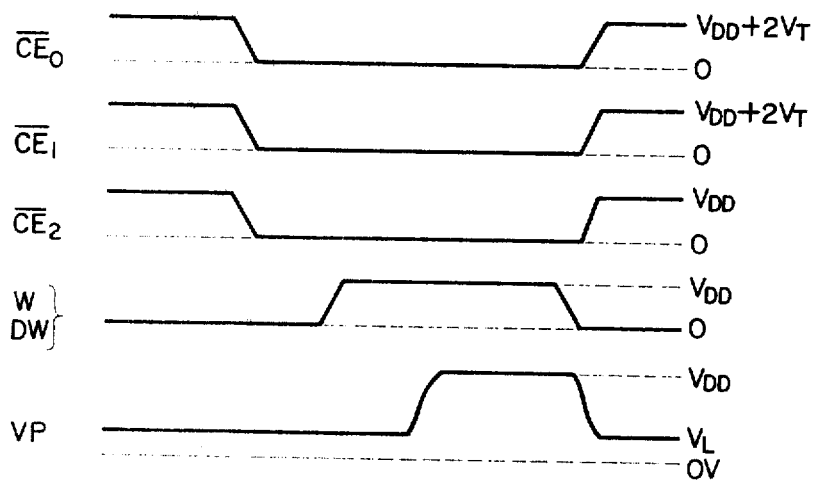
FIG. 4 shows a time diagram which serves to illustrate the operation of the system of FIG. 1.

Referring to FIG. 1 again it can be seen that a plurality of precharging field-effect transistors $Q_{P0}$ are provided. The source and drain of each of precharging field effect transistors $Q_{P0}$ are respectively connected to a corresponding data line DL or $\overline{DL}$ and a common supply line SL to which the supply voltage $V_{DD}$ is provided from a pulse circuit $PC_1$. A precharge signal $\overline{CE}_0$ is provided to each of the gate electrodes of the precharging transistors $Q_{P0}$ by way of a common precharge line POL. If the high level of the precharge signal $\overline{CE}_0$ is greater than $(V_{DD}+V_T)$, for example, equal if it is to $(V_{DD}+2\ V_T)$ as shown in FIG. 4, the data lines are precharged to the level $V_{DD}$. FIG. 1 also shows that a plurality of preamplifiers PA are also provided in the memory system.

Each of these preamplifiers PA comprises a flip-flop comprising a pair of cross-coupled field effect transistors $Q_1$ and $\overline{Q}_1$. The drains of these transistors $Q_1$ and $\overline{Q}_1$ are respectively connected to data lines DL and $\overline{DL}$, and the gates of the transistors $Q_1$ and $\overline{Q}_1$ are respectively connected to the drains of the transistors $\overline{Q}_1$ and $Q_1$. The sources of the transistors $Q_1$ and $\overline{Q}_1$ are mutually coupled at connecting points 70 which are termed latch nodes. These latch nodes 70 are connected to a preamplifier line PAL to allow common connection of the amplifiers PA to this preamplifier line PAL.

The preamplifier line PAL is connected to a source of a field effect transistor $Q_{P1}$ which has its drain connected the power supply voltage $V_{DD}$. The transistor $Q_{P1}$ precharges the line PAL, when a precharge signal $\overline{CE}_1$ provided to the gate thereof by way of a line PIL from a pulse circuit $PC_3$ is high. The signal $\overline{CE}_1$ is designed so that the difference between the precharge level of the line PAL and that of the data lines DL and $\overline{DL}$ is less than the threshold voltage $V_T$ of the transistors $Q_1$ and $\overline{Q}_1$. For example, the high level of the signal $\overline{CE}_1$ is set, as shown in FIG. 4, to be equal to $(V_{DD}+2\ V_T)$, as is the case with the signal $\overline{CE}_0$. The precharge level of the line PAL is $V_{DD}$ volts, and the transistors $Q_1$ and $\overline{Q}_1$ are non-conductive.

The line PAL is connected to a ground voltage line GL by way of a discharge field effect transistor $Q_{D1}$. The gate of the transistor $Q_{D1}$ is provided with a voltage pulse VP provided by a pulse circuit $PC_2$ by way of a discharge control line DCL. During the precharge period, the level of the voltage pulse VP is low, as shown in FIG. 4, and, therefore, the transistor $Q_{D1}$ is non-conductive.

When a memory cell MC connected to a selected one of the data lines DL is to be read out, the word line W connected to the memory ell and the dummy word line DW connected to the data lines $\overline{DL}$ are selectively enabled. When a memory cell MC connected to a selected one of the data lines $\overline{DL}$ is to be read out, the word line W connected to the memory cell MC and the dummy word line DW connected to the data lines DL are selectively enabled. The voltages of the selected word line W and dummy word line DW becomes high, as shown in FIG. 4. In either of the two cases, a memory cell MC and a dummy cell DC are read out simultaneously.

A memory cell MC, when it is read out, lowers the voltage of a corresponding data line to one of two possible voltages which depend on the stored signals of the memory cell. On the other hand, a dummy cell DC, when it is read out, lowers the voltage of a corresponding data line to a level midway between the two possible voltages.

In order to initiate the operation of the preamplifiers PA, it is necessary to make the difference between the voltage of the line PAL and that of the data lines DL and $\overline{DL}$ greater than the threshold voltage $V_T$ of transistors $Q_1$ and $\overline{Q}_1$.

The level of the voltage pulse VP is raised after a word line W and a dummy word line DW are selected, as shown in FIG. 4. Until the voltage pulse VP becomes much higher than the threshold voltage $V_T$, the transistor $Q_{D1}$ does not become conductive because of the reason explained below.

A latch circuit LCH effectively connects a low resistance $(R_L)$ and a high resistance $(R_H)$ selectively between the gate of the transistor $Q_{D1}$ and the ground voltage line GL. The latch circuit LCH comprises mutually cross-coupled transistors $Q_S$ and $Q_{D2}$. The drain of the transistor $Q_S$ is connected to the discharge control line DCL at a point 60 near the gate of the transistor $Q_{D1}$. The sources of the transistors $Q_S$ and $Q_{D2}$ are connected to the ground voltage line GL at a point 50 which is near the point 40 where the source of the transistor $Q_{D1}$ is connected. The gate of the transistor $Q_{D2}$ is connected to the drain of the transistor $Q_S$. The gate of the transistor $Q_S$ and the drain of the transistor $Q_{D2}$ are both connected to the source of the transistor $Q_{P2}$ at a point 61. The drain of the transistor $Q_{P2}$ is provided with the supply voltage $V_{DD}$ and the gate thereof is provided with a precharge signal $\overline{CE}_2$ by a pulse circuit $PC_4$. The precharge signal $\overline{CE}_2$ is high during the precharge period, as with the precharge signals $\overline{CE}_0$ and $\overline{CE}_1$, and precharges the point 61 to a voltage of $(V_{DD}-V_T)$. Therefore, during the precharge period, the gate of the transistor $Q_S$ is at a high level, and the transistor $Q_S$ is conductive and has a low resistance value $R_L$ of about 1 K$\Omega$. As a result, the discharge control line DCL and the ground voltage line GL is shunted by the low resistance.

A resistance $R_6$ interposed into the line DCL represents an equivalent lump resistance of the distributed resistance of the line DCL, and is nearly equal to 1 K$\Omega$.

Therefore, during the precharge period, the gate of the transistor $Q_{D1}$ is provided with a voltage of about $\frac{1}{2} V_L$, where $V_L$ is the low level voltage of the pulse VP. As a result, the transistor $Q_{D1}$ does not become conductive when the low level $V_L$ of the pulse VP is less than 1 volt.

When the voltage pulse VP begins to raise to the high level of $V_{DD}$ volts, the voltage of the point 60 raises in proportion to the voltage of the pulse VP. When the voltage of the point 60 becomes higher than one volt, the transistor $Q_{D1}$ becomes conductive. At the same time, the transistor $Q_{D2}$ also becomes conductive. As a result, the voltage of the point 61 decreases rapidly to the ground level, and, therefore, the transistor $Q_S$ becomes non-conductive. The transistor $Q_S$ then has a high resistance $R_H$. Therefore, the latch circuit LCH is effectively decoupled from the gate of the transistor $Q_{D1}$. Therefore, the voltage of the gate of the transistor $Q_{D1}$ becomes rapidly equal to the voltage of the pulse VP. When pulse VP raises further, the voltage of the point 60 raises also.

When the preamplifier line PAL is discharged, the preamplifiers PA amplify the voltage differences between two corresponding data lines. After amplification is finished, all control signals are returned to their levels during the precharge period.

As explained above, the transistor $Q_{D1}$ is effectively non-conductive until the voltage level of the pulse VP is greater than 1 volt. This means that the threshold voltage of the transistor $Q_{D1}$ is effectively raised by virtue of the latch circuit.

In order to assure the above-mentioned operation, the two levels $V_L$ and $V_H$ of the pulse VP and threshold voltage $V_T$ are set so that they satisfy the following inequality:

$$V_L < \left( \frac{R_L + R_6}{R_L} \right), V_T < V_H$$

The circuits $PC_1$ to $PC_4$ are connected to the ground voltage line GL at the points 10, 20, 30 and 40, respectively. These circuits provide voltage pulses the levels of which are dependent on the voltage of the ground voltage line GL at the points where they are respectively connected. The voltage of the ground voltage line GL is not uniquely determined because of distributed resistance of the line and because of current flow through the line. The resistances $R_1$ to $R_5$ represent lumped resistances equivalent to the distributed resistance of the line GL.

Although to the line GL is also connected to several other circuits which generate control signals for read out from and write-in to the memory cells, these circuits are not shown for simplicity. If some of the circuits connected to the line GL operate, current flows through the line GL and introduces voltage drops along the line. Therefore, for example, the low level $V_L$ of the voltage pulse VP varies depending on how many of these other circuits are operating, and generally is not equal to zero volts.

According to the above embodiment, however, the discharging transistor $Q_{D1}$ does not conduct if the low level $V_L$ of the pulse VP is greater than 0.5 volts, which is equal to the threshold voltage $V_T$ of the transistor, but is less than 1 volt. Therefore, according to the above embodiment, discharging by the transistor $Q_{D1}$ is stably controlled in spite of the voltage drift of the ground voltage line GL.

In the above embodiment, the pulse circuits $PC_1$ to $PC_4$ are responsive to corresponding clock signals provided by a circuit which is not shown in FIG. 1 for simplicity. The circuits $PC_1$ to $PC_4$ can be easily constructed by those skilled in the art by referring to the following literatures.

(1) IEEE Journal of Solid State Circuit, vol. SC-8, No. 5, pp. 292-331, 1973. 10;

(2) William N. Carr et al., "MOS/LSI Design & Application", published by McGraw Hill; and (3) Robert H. Crawford, "MOS-FET in Circuit Design", published by McGraw Hill.

Figure 5:
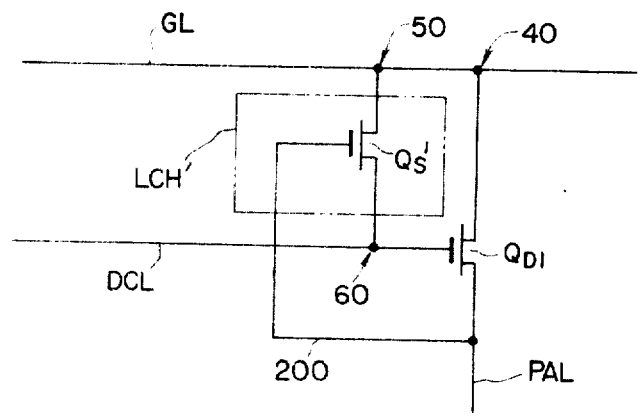
FIG. 5 shows a latch circuit of another embodiment of the present invention.

Another embodiment of the present invention can be developed by modifying the latch circuit LCH of FIG. 1 in the manner shown by the latch circuit LCH' of FIG. 5. Elements, in FIG. 5 with the same reference numerals or letters as those in FIG. 1 correspond to those elements in FIG. 1. The gate of field effect transistor $Q_S'$ is connected to the line PAL by way of a line 200, and is simultaneously precharged to the voltage $V_{DD}$ when the line PAL is precharged by the transistor $Q_{P1}$ (FIG. 1). During the precharge period, the transistor $Q_S'$ is conductive and the transistor $Q_{D1}$ is shunted by a low on-state resistance $R_L$ of the transistor $Q_S'$. When the voltage pulse level raises and the voltage level of the line DCL at the point 60 becomes greater than the threshold voltage of the transistor $Q_{D1}$, the transistor $Q_{D1}$ becomes conductive and the line PAL begins to discharge. At that time, the voltage level of the line PAL begins to fall to the ground level. According to the fall of the voltage of the line PAL, the resistance of the transistor $Q_S'$ becomes larger and the voltage at the point 60 becomes larger. Finally, the transistor $Q_{D1}$ becomes fully conductive and the transistor $Q_S'$ becomes fully non-conductive. Thus, latch circuit LCH' is effectively decoupled from the line DCL.

From the description above, it can be understood that the discharge control line DCL and the latch circuit LCH or LCH' forms a signal transformation circuit which transforms the pulse signal provided by the pulse circuit $PC_2$ into another pulse signal which has levels lower and higher than the threshold voltage of the discharge transistor $Q_{D1}$ when the pulse provided by the circuit $PC_2$ has lower and higher levels, respectively.

The present invention is not limited to the above embodiments, but includes various kinds of embodiments which those skilled in the art can make within the scope of the claims defined below. For example, the present invention can be applied to a memory system which uses P channel field effect transistors.

What is claimed:

1. A memory system comprising:
    (a) a plurality of data lines to which a plurality of memory cells are connected;
    (b) detection means connected to said plurality of data lines for detecting voltages thereof, said detection means including a latch node, wherein the operation of said detection means depends on a voltage level of said latch node such that when said latch node voltage level is in first and second ranges of voltage, said detection means is disabled and enabled, respectively;
    (c) first precharge means connected to said latch node for charging said latch node to a first voltage which is within said first range of voltage;

(d) first discharge means connected to said latch node for discharging said latch node in order to shift the voltage thereof from said first voltage to a second voltage within said second range of voltage, said first discharge means discharging when a signal applied to a control electrode thereof has a level above a predetermined threshold value;

(e) means for generating a first pulse signal having first and second levels; and (f) transformation means connected to said generating means and said control electrode of said first discharge means for transforming said first pulse signal into a second pulse signal which has levels lower and higher than said threshold value when said first pulse signal has said first and second levels, respectively.

2. A memory system according to claim 1, wherein said second level of said first pulse signal is higher than said first level and said threshold value.

3. A memory system according to claim 2, wherein said transformation means comprises means for providing said second pulse signal with third and fourth levels in response to said first and second levels of said first pulse signal, wherein a ratio of said third level to said first level is smaller than a ratio of said fourth level to said second level.

4. A memory system according to claim 3, wherein said transformation means further comprises:

input line means for resistively connecting an output terminal of said generating means to said control electrode of said first discharging means; and latch means connected to said input line means for shunting said input line means with a first resistance and a second resistance on a selective basis in response to said first and second levels of said first pulse signal, respectively, said second resistance being larger than said first resistance.

5. A memory system according to claim 4, wherein said latch means comprises:

first switching means having said first and second resistances on a selective basis when said first switching means is on and off, respectively; and wherein said latch means further comprises signal input means connected to said first switching means for providing to a control electrode of said first switching means signals to switch off and on said first switching means on a selective basis depending on whether said level of said first pulse signal of said generating means is said first or second level.

6. A memory system according to claim 5 wherein said signal input means comprises:

second precharge means connected to said control electrode of said first switching means for charging said control electrode thereof to a voltage to switch on said first switching means; and second discharge means connected to said control electrode of said first switching means for discharging said control electrode of said first switching means in response to said second level of said first pulse signal of said generating means.

7. A memory system according to claim 6 wherein said second discharge means comprises a second switching means which has an input electrode connected to said control electrode of said first switching means, an output electrode connected to said first discharge means, and a control electrode connected to said input line means.

8. A memory system according to claim 5 wherein said signal input means comprises means for connecting said latch node of said detection means to said control electrode of said first switching means.

9. A memory system according to claim 8, wherein: said first precharge means is connected to said latch node of said detection means and said control electrode of said first switching means for precharging said latch node and said control electrode of said first switching means.

10. A memory system according to claims 6, 7, 8 or 9, wherein:

said memory system comprises voltage line means commonly connected to said first discharge means and said generating means;

said first discharge means comprises a discharge switching means which conducts between input and output electrodes of said discharge switching means when said signal provided to a control electrode of said discharge switching means is larger than said threshold value of said first discharge means, said input and output electrodes being connected to said latch node and said voltage line means; and said generating means is connected to said voltage line means and provides said first pulse signal, said first level of which first pulse signal depends on a voltage of said voltage line means.

11. A memory system according to claim 10 wherein:

third precharge means is connected to each of said plurality of data lines and precharges said plurality of data lines to said first voltage;

each of said memory cells shifts a voltage of a corresponding one of said data lines from said first voltage to different voltages depending on the signals stored therein and said detection means comprises a flip-flop means including first and second transistors, respective input electrodes thereof being connected to a respective one of said plurality of data lines, respective control electrodes of said first and second transistors being connected to respective input electrodes of said second and first transistors, and respective output electrodes of said first and second transistors being mutually connected to form said latch node.

12. A memory system comprising:

a plurality of memory cells coupled to a plurality of data lines;

detection means connected to said plurality of data lines for detecting voltages thereof;

enabling means coupled to said detection means to enable said detection means by discharging a signal applied to a latch node of said detection means when a voltage applied to a control electrode of said enabling means exceeds a predetermined threshold;

pulse generating means for producing a first control pulse having first and second levels; and control means coupled between the pulse generating means and the control electrode of said enabling means to generate a second control pulse which is applied to said control electrode, wherein the second control pulse has a first level below the first predetermined threshold and a second level greater than the first predetermined threshold, and further wherein said control means will only produce said second control pulse at its second level when the first control pulse from the pulse generating means exceeds a predetermined value.

13. A memory system comprising:
(a) a plurality of data lines to which a plurality of memory cells are connected;
(b) detection means connected to said plurality of data lines for detecting voltages thereof, said detection means including a latch node, wherein the operation of said detection means depends on a voltage level of said latch node such that when said latch node voltage level is in first and second ranges of voltage, said detection means is disabled and enabled, respectively;
(c) first precharge means connected to said latch node for charging said latch node to a first voltage which is within said first range of voltage;
(d) first discharge means connected to said latch node for discharging said latch node in order to shift the voltage thereof from said first voltage to a second voltage within said second range of voltage, said first discharge means discharging when a signal applied to a control electrode thereof has a level above a predetermined threshold value;
(e) means for generating a first pulse signal having first and second levels, wherein the first level is variable within a range of values which includes voltages which are equal to or greater than the threshold value of said first discharge means; and
(f) transformation means connected between said generating means and said control electrode of said first discharge means for transforming said first pulse signal into a second pulse signal which has a lower level which is always less than the threshold value when said first pulse signal has said first level and a higher level which is always greater than the threshold value when said first pulse signal has said second level so that said first discharge means will not be enabled by said first level of said first pulse signal even when said first level has a value exceeding the threshold value.

14. A memory system according to claim 13, wherein the lower level of said second pulse signal is approximately equal to half of the first level of the first pulse signal.

* * * * *